United States Patent
Suh et al.

(10) Patent No.: US 10,189,950 B2
(45) Date of Patent: Jan. 29, 2019

(54) POLYIMIDE-BASED POLYMER THICK FILM COMPOSITIONS

(71) Applicant: E I DU PONT DE NEMOURS AND COMPANY, Wilmington, DE (US)

(72) Inventors: Seigi Suh, Cary, NC (US); Haixin Yang, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 78 days.

(21) Appl. No.: 15/375,544

(22) Filed: Dec. 12, 2016

(65) Prior Publication Data

US 2017/0174838 A1 Jun. 22, 2017

Related U.S. Application Data

(60) Provisional application No. 62/270,910, filed on Dec. 22, 2015.

(51) Int. Cl.
| | |
|---|---|
| C09D 11/00 | (2014.01) |
| C08G 73/10 | (2006.01) |
| C08K 3/04 | (2006.01) |
| C08K 3/08 | (2006.01) |
| C08K 3/38 | (2006.01) |
| H05K 3/00 | (2006.01) |
| C09D 11/033 | (2014.01) |
| C09D 11/037 | (2014.01) |
| C09D 11/102 | (2014.01) |
| C09D 11/52 | (2014.01) |
| C09D 179/08 | (2006.01) |
| H05K 1/00 | (2006.01) |

(52) U.S. Cl.
CPC ...... *C08G 73/1067* (2013.01); *C08G 73/1071* (2013.01); *C08K 3/04* (2013.01); *C08K 3/08* (2013.01); *C08K 3/38* (2013.01); *C09D 11/00* (2013.01); *C09D 11/033* (2013.01); *C09D 11/037* (2013.01); *C09D 11/102* (2013.01); *C09D 11/52* (2013.01); *C09D 179/08* (2013.01); *H05K 1/00* (2013.01); *H05K 3/00* (2013.01); *C08K 2003/0806* (2013.01); *C08K 2003/385* (2013.01)

(58) Field of Classification Search
CPC ... C08K 3/04; C08K 3/08; C08K 3/38; C09D 11/00; C09D 11/033; C09D 11/037; C09D 11/102; C09D 11/52
See application file for complete search history.

(56) References Cited

U.S. PATENT DOCUMENTS

| | | |
|---|---|---|
| 2001/0038887 A1 | 11/2001 | Yoshida et al. |
| 2008/0044639 A1 | 2/2008 | Chan et al. |
| 2013/0337604 A1 | 12/2013 | Ozawa |

OTHER PUBLICATIONS

International Search Report and Written Opinion Dated Feb. 17, 2017 for International Application No. PCT/US16/67698.

*Primary Examiner* — Edward J Cain

(57) ABSTRACT

This invention is directed to polyimide-based polymer thick film compositions and particularly non-fluorinated polyimide-based polymer thick film compositions. These compositions are comprised of certain polyimide polymers and certain solvents. In some embodiments various functional components are added to the composition to provide compositions that can be used to form various elements of an electrical circuit.

10 Claims, No Drawings

POLYIMIDE-BASED POLYMER THICK FILM COMPOSITIONS

FIELD OF THE INVENTION

This invention is directed to polyimide-based polymer thick film compositions for use in electrical circuits and similar-type applications. The polyimides, and notably non-fluorinated polyimides, are dissolved in environmentally friendly solvents.

BACKGROUND OF THE INVENTION

Dielectrics, resistors, capacitors, inductors, electrical and thermal conductors, and similar-type electronic components or devices can be made from thick film compositions, referred to as "pastes", that are used to form thick film elements often by means of screen-printing techniques.

Generally, a thick film composition comprises a functional phase that imparts appropriate electrically functional properties to the composition. The functional phase comprises electrically functional powders dispersed in an organic solvent containing a polymer. These compositions will typically contain a binder, e.g., a glass frit. Such a composition is fired to burn out the polymer and solvent and to impart the electrically functional properties. However, in the case of a polymer thick film (PTF) composition, the polymer remains as an integral part of the composition after drying and only the solvent is removed. A processing requirement may include an heat treatment such as curing as known to those skilled in the art of polymer thick film technology.

Increasingly, such PTF compositions are required to consist of a polymer highly soluble in useful solvents with relatively low (unwanted) water sorption. As used herein, "sorption" is intended to mean adsorption and/or absorption. The compositions are desirably processed, i.e., cured at relatively low temperatures, such as, 150 to 200° C.

There is a need for polyimide-based thick film composition to satisfy these needs and particularly for such compositions containing non-fluorinated polyimides.

SUMMARY OF THE INVENTION

This invention provides a polyimide-based polymer thick film composition comprising:
(a) a polyimide polymer with the structure I

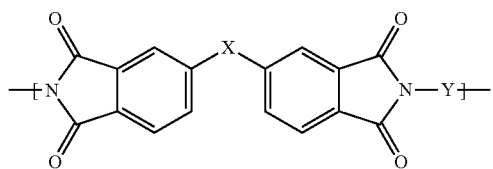

wherein X is $C(CH_3)_2$, O, $S(O)_2$, $C(CF_3)_2$, O-Ph-$C(CH_3)_2$-Ph-O, O-Ph-O— or a mixture thereof;
wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(hexafluoroisopropylidene)bis(2-aminophenol) (6F-AP), bis-(4-(4-aminophenoxy) phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)] hexafluoropropane (HFBAPP), 1,3-bis(3-aminophenoxy) benzene (APB-133), 2,2-bis(3-aminophenyl) hexafluoropropane, 2,2-bis(4 aminophenyl)hexafluoropropane (bis-A-AF), 4,4'-bis(4-amino-2-trifluoromethylphenoxy) biphenyl, 4,4'-[1,3-phenylenebis(1-methyl-ethylidene)], and bisaniline (bisaniline-M) with the following provisos:
 i) if X is O, then Y is not MPD, BAPS, 3,4'-ODA, BAPP, APB-133, or bisaniline-M;
 ii) if X is $S(O)_2$, then Y is not 3,3'-DDS;
 iii) if X is O-Ph-$C(CH_3)_2$-Ph-O or O-Ph-O—, then Y is not MPD, FDA, 3,4'-ODA, DAM, BAPP, APB-133, or bisaniline-M;
 iv) if X is $C(CF_3)_2$, then Y is not MPD, BAPS, FDA, or 3,3'-DDS; and
(b) an organic solvent comprising one or more components selected from the group with structures II, III, IV, V and VI:

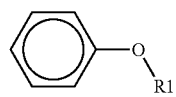

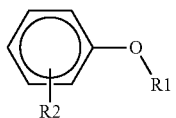

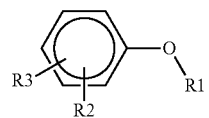

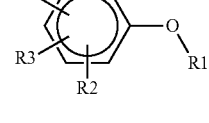

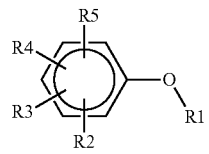

wherein R1=$CH_3$, $CH_2CH_3$, $CH_2CH_2CH_3$, or $CH(CH_3)_2$; R2=$CH_3$, $CH_2CH_3$, $OCH_3$, $OCH_2CH_3$, $OCF_3$, $C(O)OCH_3$, $CH_2Cl$, F or Cl; R3=H, F, $CH_3$, $CH_2CH_3$ or $OCH_3$; R4=F, $CH_3$ or $CH_2CH_3$ and R5=F or $CH_3$.

The above composition encompasses both fluorinated and non-fluorinated polyimide polymers.

In an embodiment the polyimide polymer is non-fluorinated and it provides a polyimide-based polymer thick film composition comprising;
(a) a non-fluorinated polyimide polymer with the structure I

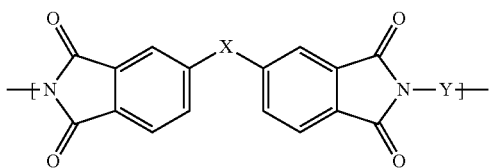

wherein X is C(CH$_3$)$_2$, O, S(O)$_2$, O-Ph-C(CH$_3$)$_2$-Ph-O, O-Ph-O— or a mixture thereof;

wherein Y is a diamine component or a mixture of diamine components selected from the group consisting of: m-phenylenediamine (MPD), 3,4'-diaminodiphenylether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl)]propane (BAPP), 1,3-bis(3-aminophenoxy) benzene (APB-133), 4,4'-bis(4-amino-2-trifluoromethylphenoxy) biphenyl, 4,4'-[1,3-phenylenebis(1-methyl-ethylidene)], and bisaniline (bisaniline-M) with the following provisos:
i) if X is O, then Y is not MPD, BAPS, 3,4'-ODA, BAPP, APB-133, or bisaniline-M;
ii) if X is S(O)$_2$, then Y is not 3,3'-DDS;
iii) if X is O-Ph-C(CH$_3$)$_2$-Ph-O or O-Ph-O—, then Y is not MPD, 3,4'-ODA, DAM, BAPP, APB-133, or bisaniline-M; and
an organic solvent comprising one or more components selected from the group with structures II, III, IV, V and VI:

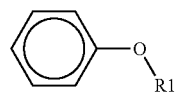

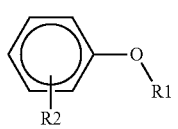

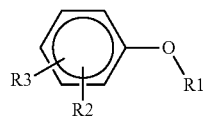

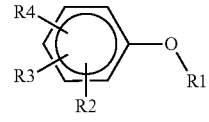

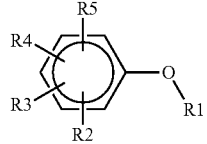

wherein R1=CH$_3$, CH$_2$CH$_3$, CH$_2$CH$_2$CH$_3$, or CH(CH$_3$)$_2$; R2=CH$_3$, CH$_2$CH$_3$, OCH$_3$, OCH$_2$CH$_3$, C(O)OCH$_3$ or CH$_2$Cl; R3=H, CH$_3$, CH$_2$CH$_3$ or OCH$_3$; R4=CH$_3$ or CH$_2$CH$_3$ and R5=CH$_3$.

The invention also provides polyimide-based polymer thick film compositions with either fluorinated or non-fluorinated polyimide polymers with the addition of a functional component to the above compositions. When a non-fluorinated polyimide polymer is used the invention provides a polyimide-based polymer thick film composition comprising:
(a) a functional component;
(b) a non-fluorinated polyimide polymer with the structure I

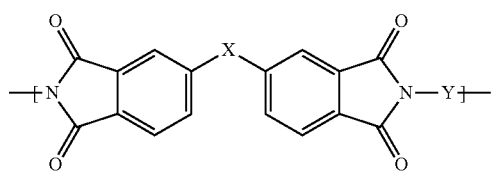

wherein X is C(CH$_3$)$_2$, O, S(O)$_2$, O-Ph-C(CH$_3$)$_2$-Ph-O, O-Ph-O— or a mixture thereof;

wherein Y is a diamine component or a mixture of diamine components selected from the group consisting of: m-phenylenediamine (MPD), 3,4'-diaminodiphenyl ether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl)]propane (BAPP), 1,3-bis(3-aminophenoxy) benzene (APB-133), 4,4'-bis(4-amino-2-trifluoromethylphenoxy) biphenyl, 4,4'-[1,3-phenylenebis(1-methyl-ethylidene)], and bisaniline (bisaniline-M) with the following provisos:
i) if X is O, then Y is not MPD, BAPS 3,4'-ODA, BAPP, APB-133, or bisaniline-M;
ii) if X is S(O)$_2$, then Y is not 3,3'-DDS;
iii) if X is O-Ph-C(CH$_3$)$_2$-Ph-O or O-Ph-O—, then Y is not MPD, 3,4'-ODA, DAM, BAPP, APB-133, or bisaniline-M; and
(c) an organic solvent comprising one or more components selected from the group with structures II, III, IV, V and VI:

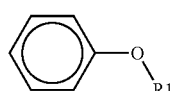

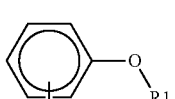

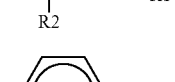

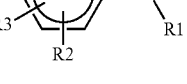

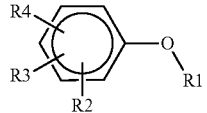

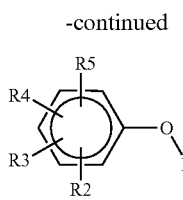

wherein R1=CH$_3$, CH$_2$CH$_3$, CH$_2$CH$_2$CH$_3$, or CH(CH$_3$)$_2$; R2=CH$_3$, CH$_2$CH$_3$, OCH$_3$, OCH$_2$CH$_3$, C(O)OCH$_3$ or CH$_2$Cl; R3=H, CH$_3$, CH$_2$CH$_3$ or OCH$_3$; R4=CH$_3$ or CH$_2$CH$_3$ and R5=CH$_3$.

A functional component may be added to the polyimide-based PTF composition so as to provide an electrical conductor PTF composition, an encapsulant PTF composition, a dielectric PTF composition, a resistor PTF composition, a capacitor PTF composition or a thermal conductor composition. As used herein "an electrical conductor PTF composition" is used to indicate the kind of element, i.e., in this instance, "an electrical conductor", that can be formed from the PTF composition. Similarly with the other PTF compositions listed above. The invention also provides electrical circuits comprising elements formed from these PTF compositions.

DETAILED DESCRIPTION OF INVENTION

The polyimide-based PTF compositions of the invention are comprised of polyimide polymers and solvents in which the polyimide polymers are soluble. The polyimide polymers and the solvents useful in these compositions are indicated in the Summary for both fluorinated and non-fluorinated polyimides. Non-fluorinated polyimide polymers have not been used in screen printing because of their poor solubility in the solvents commonly used in PTF compositions. The different type of solvents, aryl alkyl ethers or aryl alkyl ether esters, used herein dissolve the non-fluorinated polyimide polymers and enable the forming of PTF pastes that are more environmentally friendly by eliminating the possibility of the generation of HF gas.

The polyimide polymers, the solvents and the various functional components that can be added to polyimide-based PTF compositions and the elements they provide will be discussed below.

Polyimide Polymers

The fluorinated and non-fluorinated polyimide polymers useful in the compositions of the invention have the structure I

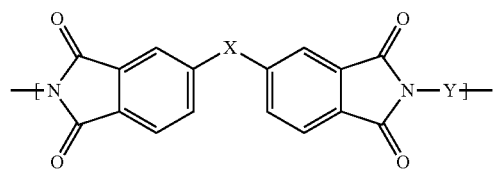

wherein X is C(CH$_3$)$_2$, O, S(O)$_2$, C(CF$_3$)$_2$, O-Ph-C(CH$_2$-Ph-O, O-Ph-O— or a mixture thereof;
wherein Y is a diamine component or a mixture of diamine components selected from the group consisting of: m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4'-(hexafluoroisopropylidene)bis (2-aminophenol) (6F-AP), bis-(4-(4-aminophenoxy) phenyl)sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)] hexafluoropropane (HFBAPP), 1,3-bis(3-aminophenoxy) benzene (APB-133), 2,2-bis(3-aminophenyl) hexafluoropropane, 2,2-bis(4 aminophenyl)hexafluoropropane (bis-A-AF), 4,4'-bis(4-amino-2-trifluoromethylphenoxy) biphenyl, 4,4'-[1,3-phenylenebis(1-methyl-ethylidene)], and bisaniline (bisaniline-M) with the following provisos:
i) if X is O, then Y is not MPD, BAPS, 3,4'-ODA, BAPP, APB-133, or bisaniline-M;
ii) if X is S(O)$_2$, then Y is not 3,3'-DDS;
iii) if X is O-Ph-C(CH$_3$)$_2$-Ph-O or O-Ph-O—, then Y is not MPD, FDA, 3,4'-ODA, DAM, BAPP, APB-133, or bisaniline-M;
iv) if X is C(CF$_3$)$_2$, then Y is not MPD, BAPS, FDA, or 3,3'-DDS.

Some combinations of X and Y do not result in polyimide polymers that are useful in the compositions of the invention and these are excluded by the various provisos.

The non-fluorinated polyimide polymers useful in the compositions of the invention have the structure I

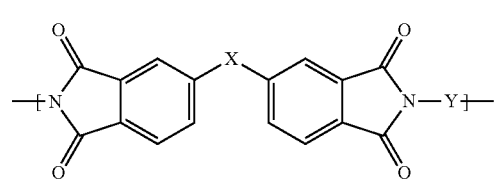

wherein X is C(CH$_3$)$_2$, O, S(O)$_2$, O-Ph-C(CH$_3$)$_2$-Ph-O, O-Ph-O— or a mixture thereof;
wherein Y is a diamine component or a mixture of diamine components selected from the group consisting of: m-phenylenediamine (MPD), 3,4'-diaminodiphenyl ether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl)]propane (BAPP), 1,3-bis(3-aminophenoxy) benzene (APB-133), 4,4'-bis(4-amino-2-trifluoromethylphenoxy) biphenyl, 4,4'-[1,3-phenylenebis(1-methyl-ethylidene)], and bisaniline (bisaniline-M) with the following provisos:
i) if X is O, then Y is not MPD, BAPS 3,4'-ODA, BAPP, APB-133, or bisaniline-M;
ii) if X is S(O)$_2$, then Y is not 3,3'-DDS;
iii) if X is O-Ph-C(CH$_3$)$_2$-Ph-O or O-Ph-O—, then Y is not MPD, 3,4'-ODA, DAM, BAPP, APB-133, or bisaniline-M.

Some combinations of X and Y do not result in polyimide polymers that are useful in the compositions of the invention and these are excluded by the various provisos.

Polyimide polymers are generally prepared from a dianhydride, or the corresponding diacid-diester, diacid halide ester, or tetra-carboxylic acid derivative of the dianhydride, and a diamine.

For purposes of the present invention, a particular group of dianhydrides was discovered to be particularly useful in the preparation of water resistant polyimide pastes. These dianhydrides are 4,4'-oxydiphthalic anhydride (ODPA), bis (3,4-dicarboxyphenyl)sulfoxide dianhydride (DSDA), 2,2-bis-(3,4-dicarboxyphenyl) 1,1,1,3,3,3,-hexafluoropropane dianhydride (6-FDA) and 4,4'-(4,4'-isopropylidenediphenoxy)bis-(phthalic anhydride) (BPADA). For the non-fluorinated polyimide pastes these dianhydrides are 4,4'-oxydiphthalic anhydride (ODPA), bis(3,4-dicarboxyphenyl) sulfoxide dianhydride (DSDA), and 4,4'-(4,4'-isopropylidenediphenoxy)bis-(phthalic anhydride) (BPADA).

For purposes of the present invention, a particular group of diamines was discovered to be particularly useful in the preparation of water resistant polyimide solutions and pastes. These diamines are m-phenylenediamine (MPD), 3,4'-diaminodiphenyl ether (3,4'-ODA), 4,4'-diamino-2,2'-bis(trifluoromethyl)biphenyl (TFMB), 3,3'-diaminodiphenyl sulfone (3,3'-DDS), 4,4-(hexafluoroisopropylidene)bis(2-aminophenol) (6F-AP), bis-(4-(4-aminophenoxy)phenyl) sulfone (BAPS), 9,9-bis(4-aminophenyl)fluorene (FDA); 2,3,5,6-tetramethyl-1,4-phenylenediamine (DAM), 2,2-bis[4-(4-aminophenoxyphenyl)]propane (BAPP), 2,2-bis[4-(4-aminophenoxyphenyl)] hexafluoropropane (HFBAPP), 1,3-bis(3-aminophenoxy) benzene (APB-133), 2,2-bis(3-aminophenyl)hexafluoropropane, 2,2-bis(4 aminophenyl) hexafluoropropane (bis-A-AF), 4,4'-bis(4-amino-2-trifluoromethylphenoxy) biphenyl; 4,4'-[1,3-phenylenebis (1-methyl-ethylidene)], and bisaniline (bisaniline-M).

For the non-fluorinated polyimide polymer pastes these diamines are m-phenylenediamine (MPD), 3,4'-diaminodiphenyl ether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl]propane (BAPP), 1,3-bis (3-aminophenoxy) benzene (APB-133), 4,4'-bis(4-amino-2-trifluoromethylphenoxy) biphenyl, 4,4'-[1,3-phenylenebis (1-methyl-ethylidene)], and bisaniline (bisaniline-M).

As indicated previously, some combinations of these dianhydrides and diamines will not form a useful polyimide solution paste. For instance, if ODPA is selected as the dianhydride and either MPD, BAPS 3,4'-ODA, BAPP, APB-133, or bisaniline-M is chosen as the diamine, a less useful polyimide is formed. In addition, if DSDA is selected as the dianhydride, then 3,3'-DDS is not a useful diamine. These and other combinations that are not useful are excluded by the various provisos. However, all other combinations of the diamines and dianhydrides disclosed herein will form useful polyimide polymers for the purposes of this invention.

Solvents

The solvents used in the polyimide-based PTF compositions of the invention are aryl alkyl ethers and aryl alkyl ether esters. The solvents used herein have the structures II, III, IV, V and VI:

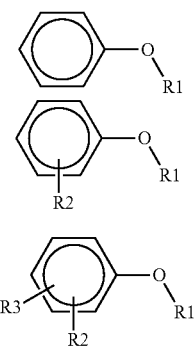

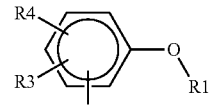

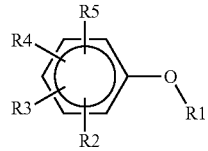

wherein $R1=CH_3$, $CH_2CH_3$, $CH_2CH_2CH_3$, or $CH(CH_3)_2$; $R2=CH_3$, $CH_2CH_3$, $OCH_3$, $OCH_2CH_3$, $OCF_3$, $C(O)OCH_3$, $CH_2Cl$, F or Cl; $R3=H$, F, $CH_3$, $CH_2CH_3$ or $OCH_3$; $R4=F$, $CH_3$ or $CH_2CH_3$ and $R5=F$ or $CH_3$.

The polyimide polymers used herein are generally soluble in the above solvents, although not every polyimide polymer is soluble in every solvent. These solvents used have boiling points in the range of 150-280° C. Boiling points at 150-200° C. enable curing at these desirably lower temperatures. In some instances the solvent must be warmed in order for the polyimide polymer to be soluble. However, in those instances the polyimide polymer remains in solution when cooled to ambient temperature.

Functional Component

A functional component may be added to the polyimide-based PTF compositions. In one embodiment, the addition of a functional component provides a composition that can be used to form an element in an electrical circuit has a property provided by the functional component.

A functional component may be added to the polyimide-based PTF composition so as to provide an electrical conductor PTF composition, an encapsulant PTF composition, a dielectric PTF composition, a resistor PTF composition, a capacitor PTF composition or a thermal conductor composition. Each of these will be discussed in turn.

As used herein a "polyimide-based electrical conductor PTF composition" is used to indicate the kind of element that can be formed from the PTF composition, in this case, "an electrical conductor", A "polyimide-based resistor PTF composition is used to indicate the kind of element that can be formed from the PTF composition, in this case, "a resistor", Similarly with the other PTF compositions listed above. The invention also provides electrical circuits comprising elements formed from these PTF compositions wherein the PTF compositions have been dried to remove the solvents and form the elements.

Electrical Conductive Metal Powder

An electrical conductive metal powder, wherein the metal is selected from the group consisting of Ag, Cu, Au, Pd, Pt, Sn, Al, Ni, an alloy of Ag, Cu, Au, Pd, Pt, Sn, Al, Ni and mixtures thereof, is the functional component in the polyimide-based electrical conductor polymer thick film composition. In one embodiment of the polyimide-based electrical conductor polymer thick film composition the functional component is silver powder.

Resistor Powder

A powder selected from the group of powders consisting of graphite, carbon black, graphene, metal oxides and mixtures thereof is the functional component in the polyimide-based resistor polymer thick film composition. In one embodiment of the polyimide-based resistor polymer thick film composition the functional component is a mixture of graphite and carbon black Capacitor Powder A powder selected from the group of powders consisting of strontium titanate, barium titanate, lead magnesium titanate, titanium dioxide and mixtures thereof is the functional component in the polyimide-based capacitor polymer thick film composition.

Dielectric Powder

A powder selected from the group of powders consisting of metal oxides, metal nitrides and mixtures thereof is the functional component in the polyimide-based dielectric polymer thick film composition.

Thermal Conductor Powder

A powder selected from the group of powders consisting of barium nitride, aluminum nitride, boron nitride, aluminum oxide, graphite, graphene, beryllium oxide, silver, copper, diamond and mixtures thereof is the functional component in the polyimide-based thermal conductor polymer thick film composition.

Encapsulant Powder

A powder selected from the group of powders consisting of fumed silica, alumina, titanium dioxide and mixtures thereof is the functional component in the polyimide-based encapsulant polymer thick film composition.

EXAMPLES AND COMPARATIVE EXPERIMENTS

The substrates used in the Examples were Kapton® 500HPP-ST and Kapton® 200RS100 films (obtained from the DuPont Co, Wilmington, Del.) and used as received after cut into 2.5×3.5" pieces and alumina (AD-96) substrates (obtained from CoorsTek, Golden, Colo.) used with no further cleaning.

The non-fluorinated polyimide polymer #1 used in Examples 1-7, 9 and 10 was prepared by reacting APB-133 and BPADA in a molar ratio of 1/1.

The non-fluorinated polyimide polymer #2 used in Examples 1-4 and 8 was prepared by reacting BAPP and BPADA in a molar ratio of 1/1.

The non-fluorinated polyimide polymer #3 used in Examples 1-4 was prepared by reacting BAPP and DSDA in a molar ratio of 1/1.

The non-fluorinated polyimide polymer polyimide #4 used in Examples 1-4 was prepared by reacting APB-133 and DSDA in a molar ratio of 1/1.

The SAC alloy with a composition of Sn96.5% Ag3.0% Cu0.5% was used for the solder wetting test. Either Alpha 611 or Kester 952 flux was used. In the solder wetting test the cured samples were typically dipped for 1-3 seconds into the SAC alloy pot that was kept at 225-250° C.

The graphite was obtained from Ashylen (HPN-10). Both carbon black #1 (MONARCH 120) and carbon black #2 (VULCAN XC72R) were obtained from Cabot Corp.

The non-fluorinated polyimide polymer #1 was used in Comparative Experiments A-G and Examples 1-7, 9 and 10 and was prepared by reacting APB-133 and BPADA in a molar ratio of 1/1.

The non-fluorinated polyimide polymer #2 was used in Comparative Experiments A-G and Examples 1-4 and 8 and was prepared by reacting BAPP and BPADA in a molar ratio of 1/1.

The non-fluorinated polyimide polymer #3 used in Comparative Experiments A-G and Examples 1-4 and was prepared by reacting BAPP and DSDA in a molar ratio of 1/1.

The non-fluorinated polyimide polymer polyimide #4 used in Comparative Experiments A-G and Examples 1-4 and was prepared as described above by reacting APB-133 and USDA in a molar ratio of 1/1.

Comparative Experiments A-G

Table I shows the result of a solubility test using the polyimide polymers #1, #2, #3, and #4 in the various solvents at a 20% level. The polyimide polymers were insoluble in the solvents (Comparative Experiments A-G) commonly used in screen printing technology.

TABLE I

| Comparative Experiment | Solvent | Type of Solvent | Polymer #1 | Polymer #2 | Polymer #3 | Polymer #4 |
|---|---|---|---|---|---|---|
| A | butylcarbitol acetate | ether ester | i | i | i | i |
| B | dibasic acetate (DBE) | diester | i | i | i | i |
| C | dipropylene glycol monomethyl ether | ether alcohol | i | i | i | i |
| D | terpeniol | alcohol | i | i | i | i |
| E | ethylene glycol | di-ol | i | i | i | i |
| F | triethyl phospate | alkyl phosphate | i | i | i | i |
| G | diethylene glycol dibutyl ether | alkyl ether | i | i | i | i | i = insoluble

Examples 1-4

Table II shows the result of a solubility test using the polyimide polymers #1, #2, #3, and #4 in the various solvents at a 20% level. The solvents used in all four Examples have structure IV

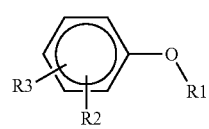

IV wherein in Examples 1 and 2, R1=CH3, R2=OCH3, R3=H;

in Example 3, R1=CH3, R2=OCH3, R3=CH3; and in Example 4, R1=CH3, R2=C(O)OCH3, R3=H The polyimide polymers #1 and #2 were completely soluble in all four solvents at ambient temperature. Polyimide polymer #3 was insoluble in the solvents used in Examples 1 and 2 and was partially soluble in the solvent used in Example 3. Polyimide polymer #3 was completely soluble in the solvent used in Example 4. Polyimide polymer #4 was completely soluble in all four solvents when warmed and remained in solution when cooled to ambient temperature.

TABLE II

| Example | Solvent | Type of Solvent | Polymer #1 | Polymer #2 | Polymer #3 | Polymer #4 |
|---|---|---|---|---|---|---|
| 1 | 1,2-dimethoxybenzene | aryl alkyl ether | s | s | i | s |
| 2 | 1,3-dimethoxybenzene | aryl alkyl ether | s | s | i | s |
| 3 | dimethoxytoluene | aryl alkyl ether | s | s | ps | s |
| 4 | Methyl 2-methoxybenzoate | aryl alkyl ether ester | s | s | s | s | i = insoluble; s = soluble and ps = partially soluble

Example 5

A screen printable polyimide-based electrical conductor PTF composition was prepared using silver flakes having an average particle size of 3-4 micron. The components of the silver electrical conductor PTF composition were:

| | |
|---|---|
| 80 wt % | silver powder |
| 10.7 wt % | polyimide #1 |
| 9.3 wt % | 1,2-dimethoxybenzene | wherein the wt % are based on the total weight of the composition.

The components were combined and mixed for 30-60 seconds in a Thinky-type mixer and then roll-milled. The composition was used to screen print a square serpentine pattern on Kapton® 500HPP-ST film. Using a 325 mesh stainless steel screen, several patterns were printed, and the silver paste was dried at 130° C. for 10 min, and then at 200° C. for 30 min. The measured line resistance for the samples was 4.7Ω. The average conductor thickness over the length of the square pattern was determined to be 11.9 μm using a profilometer. The resistivity was calculated to be 4.7 mΩ/□/mil. Some of the samples were cured further for 1 h at 300° C. and the resistivity was 2.7 mΩ/□/mil.

Solder wettability was tested in the manner described above using the samples cured at 300° C. These samples showed nearly 100% solder wetting.

The composition was also used to screen print a similar square serpentine pattern on Kapton® 200RS100 film. Using a 325 mesh stainless steel screen, several patterns were printed, and the silver paste was dried at 130° C. for 10 min, and then at 200° C. for 30 min. The measured line resistance for the samples was 6.3Ω. The average conductor thickness over the length of the serpentine pattern was determined to be 16.2 μm using a profilometer. The resistivity was calculated to be 4.2 mΩ/□/mil. Some of the samples were cured further for 1 h at 300° C. and the resistivity was 3.0 mΩ/□/mil.

Example 6

A screen printable polyimide-based electrical conductor PTF composition was prepared using silver flakes having an average particle size of 3-4 micron. The components of the silver electrical conductor PTF composition were:

| | |
|---|---|
| 77.9 wt % | silver powder |
| 13 wt % | polyimide #1 |
| 9.1 wt % | 1,2-dimethoxybenzene | wherein the wt % are based on the total weight of the composition.

The components were combined and mixed for 30-60 seconds in a Thinky-type mixer and then roll-milled. The composition was used to screen print a square serpentine pattern on Kapton® 500HPP-ST film. Using a 325 mesh stainless steel screen, several patterns were printed, and the silver paste was dried at 130° C. for 10 min, and then at 200° C. for 30 min. The measured line resistance for the samples was 6.8Ω. The average conductor thickness over the length of the serpentine pattern was determined to be 12.2 μm using a profilometer. The resistivity was calculated to be 5.5 mΩ/□/mil. Some of the samples were cured further for 1 h at 300° C. and the average resistivity was 3.2 mΩ/□/mil.

Solder wettability was tested in the manner described above using the samples cured at 300° C. These samples showed nearly 100% solder wetting.

The composition was also used to screen print a similar square serpentine pattern on Kapton® 200RS100 film. Using a 325 mesh stainless steel screen, several patterns were printed, and the silver paste was dried at 130° C. for 10 min, and then at 200'C for 30 min. The measured line resistance for the samples was 7.2Ω. The average conductor thickness over the length of the serpentine pattern was determined to be 13.5 μm using a profilometer. The resistivity was calculated to be 3.9 mΩ/□/mil. Some of the samples were cured further for 1 h at 300° C. and the resistivity was 2.9 mΩ/□/mil.

Example 7

A screen printable polyimide-based electrical conductor PTF composition was prepared using silver flakes having an average particle size of 3-4 micron. The components of the silver electrical conductor PTF composition were:

| | |
|---|---|
| 82.7 wt % | silver powder |
| 12.3 wt % | polyimide #1 |
| 5 wt % | 1,3-dimethoxybenzene | wherein the wt % are based on the total weight of the composition.

The components were combined and mixed for 30-60 seconds in a Thinky-type mixer and then roll-milled. The composition was used to screen print a square serpentine pattern on Kapton® 500HPP-ST film. Using a 325 mesh stainless steel screen, several patterns were printed, and the silver paste was dried at 130° C. for 10 min, and then at 200° C. for 30 min. The measured line resistance for the samples was 5.1Ω. The average conductor thickness over the length of the serpentine pattern was determined to be 12.7 μm using a profilometer. The resistivity was calculated to be 4.3 mΩ/□/mil. Some of the samples were cured further for 1 h at 300° C. to give an average resistivity of 2.6 mΩ/□/mil.

Solder wettability was tested in the manner described above using the samples cured at 300° C. These samples showed nearly 100% solder wetting.

Example 8

A screen printable polyimide-based electrical conductor PTF composition was prepared using silver flakes having an average particle size of 3-4 micron. The components of the silver electrical conductor PTF composition were:

| 82.5 wt % | silver powder |
|---|---|
| 12.2 wt % | polyimide #2 medium |
| 5.3 wt % | 1,3-dimethoxybenzene | wherein the wt % are based on the total weight of the composition.

The components were combined and mixed for 30-60 seconds in a Thinky-type mixer and then roll-milled. The composition was used to screen print a square serpentine pattern on Kapton® 500HPP-ST film. Using a 325 mesh stainless steel screen, several patterns were printed, and the silver paste was dried at 130° C. for 10 min, and then at 200° C. for 30 min. The measured line resistance for the samples was 5.0Ω. The average conductor thickness over the length of the serpentine pattern was determined to be 12.0 μm using a profilometer. The resistivity was calculated to be 4.0 mΩ/□/mil. Some of the samples were cured further for 1 h at 300° C. to give an average resistivity of 2.3 mΩ/□/mil, respectively.

Solder wettability was tested in the manner described above using the samples cured at 300° C. These samples showed nearly 100% solder wetting.

The composition was also used to screen print a similar square serpentine pattern on Kapton® 200RS100 film. Using a 325 mesh stainless steel screen, several patterns were printed, and the silver paste was dried at 130° C. for 10 min, and then at 200° C. for 30 min. The measured line resistance for the samples was 3.6 D. The average conductor thickness over the length of the serpentine pattern was determined to be 14.2 μm using a profilometer. The resistivity was calculated to be 3.4 mΩ/□/mil.

Example 9

A screen printable polyimide-based resistor PTF composition was prepared using graphite and carbon black. The components of the PTF resistor composition were:

| 8.9 wt % | graphite |
|---|---|
| 11.8 wt % | carbon black #1 |
| 21.9 wt % | polyimide #1 |
| 57.4 wt % | 1,2-dimethoxybenzene | wherein the wt % are based on the total weight of the composition.

The components were combined and mixed for 30-60 seconds in a Thinky-type mixer and then roll-milled. The composition was used to screen print square serpentine resistor pattern on Kapton® 500HPP-ST with the PTF Ag conductor terminations printed and cured at 200° C. for 30 min using the silver conductor paste of Example 7. Using a 200 mesh stainless steel screen, several patterns were printed, and the resistor paste was cured at 130° C. for 10 min, and then 200° C. for 90 min to give an average resistance of 1KΩ/□ at an average thickness of 23 micron.

Example 10

Four square bottom silver electrodes (each 17 mm×17 mm) and 4-up top electrodes (each dimension of 16 mm×16 mm) were formed on Kapton® 500HPP-ST film using the silver conductor paste of Example 7 and a 325 mesh stainless steel screen. The silver paste was dried at 130° C. for 10 min and then at 200° C. for 30 min to form the four silver electrodes.

A screen printable polyimide-based dielectric PTF composition was prepared using boron nitride. The components of the PTF dielectric composition were:

| 22 wt % | boron nitride powder |
|---|---|
| 66 wt % | polyimide #1 |
| 12 wt % | 1,2-dimethoxybenzene | wherein the wt % are based on the total weight of the composition.

The components were combined and mixed for 30-60 seconds in a Thinky-type mixer and then roll-milled. The composition was used to screen print a 49 mm×49 mm square over the bottom PTF silver conductors using a 200 mesh stainless steel screen, and the dielectric paste was dried at 130° C. for 10 min, and then at 200° C. for 60 min. The thickness of the boron nitride dielectric layer was about 40 μm as measured using a profilometer.

Four top electrodes (each 16 mm×16 mm) were screen printed on the dielectric layer directly over the four the bottom electrodes using the silver conductor paste in Example 7 and a 325 mesh stainless steel screen. The top electrode silver paste was dried at 130° C. for 10 min, and then at 200° C. for 30 min to form the four top electrodes.

The average breakdown voltage of the sample was 4.7 kilovolts and the capacitance was 199 pF @ 1 k Hz.

What is claimed is:

1. A polyimide-based polymer thick film composition comprising:

(a) a non-fluorinated polyimide polymer with the structure I

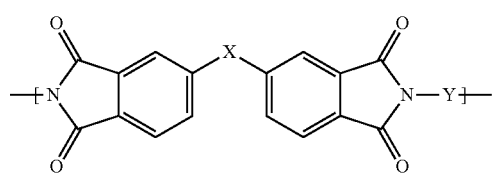

wherein X is S(O)$_2$ and Y is BAPP and;

(b) an organic solvent with the structure IV

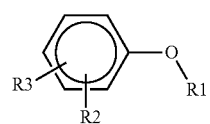

wherein R1=CH$_3$, R2=C(O)OCH$_3$ and R3=H.

2. A polyimide-based polymer thick film composition comprising:

(a) a non-fluorinated polyimide polymer with the structure I

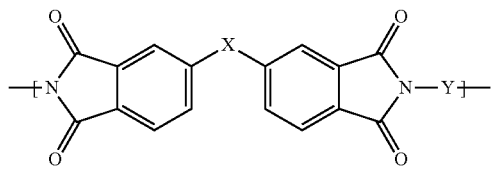

wherein X is S(O)$_2$ and Y is APB-133 and;

(b) an organic solvent comprising one or more components selected from the group with the structure IV

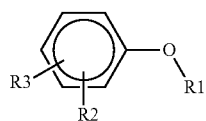

wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H.

3. A polyimide-based polymer thick film composition comprising:

(a) a mixture of graphite and carbon black powders;
(b) a non-fluorinated polyimide polymer with the structure I

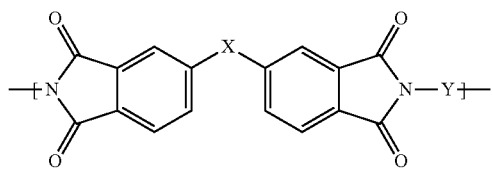

wherein X is C(CH$_3$)$_2$, O, S(O)$_2$, O-Ph-C(CH$_3$)$_2$-Ph-O, O-Ph-O— or a mixture thereof;

wherein Y is a diamine component or a mixture of diamine components selected from the group consisting of: m-phenylenediamine (MPD), 3,4'-diaminodiphenyl ether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl)]propane (BAPP), 1,3-bis(3-aminophenoxy) benzene (APB-133), 4,4'-bis(4-amino-2-trifluoromethylphenoxy) biphenyl, 4,4'-[1,3-phenylenebis(1-methyl-ethylidene)], and bisaniline (bisaniline-M) with the following provisos:

i) if X is O, then Y is not MPD, BAPS 3,4'-ODA, BAPP, APB-133, or bisaniline-M;
ii) if X is S(O)$_2$, then Y is not 3,3'-DDS;
iii) if X is O-Ph-C(CH$_3$)$_2$-Ph-O or O-Ph-O—, then Y is not MPD, 3,4'-ODA, DAM, BAPP, APB-133, or bisaniline-M; and (c) an organic solvent comprising one or more components selected from the group with structures II, III, IV, V and VI:

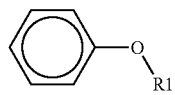

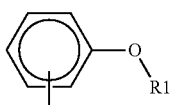

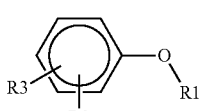

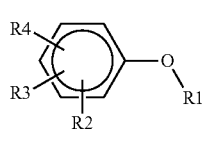

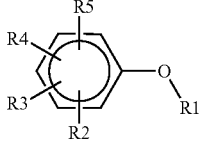

wherein R1=CH$_3$, CH$_2$CH$_3$, CH$_2$CH$_2$CH$_3$, or CH(CH$_3$)$_2$; R2=CH$_3$, CH$_2$CH$_3$, OCH$_3$, OCH$_2$CH$_3$, C(O)OCH$_3$ or CH$_2$Cl; R3=H, CH$_3$, CH$_2$CH$_3$ or OCH$_3$; R4=CH$_3$ or CH$_2$CH$_3$ and R5=CH$_3$.

4. An electrical circuit comprising a resistor formed from a polyimide-based polymer thick film composition comprising:

(a) a mixture of graphite and carbon black powders;
(b) a non-fluorinated polyimide polymer with the structure I

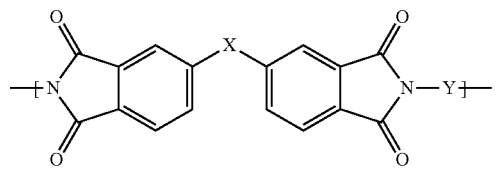

wherein X is C(CH$_3$)$_2$, O, S(O)$_2$, O-Ph-C(CH$_3$)$_2$-Ph-O, O-Ph-O— or a mixture thereof;

wherein Y is a diamine component or a mixture of diamine components selected from the group consisting of: m-phenylenediamine (MPD), 3,4'-diaminodiphenyl ether (3,4'-ODA), 3,3'-diaminodiphenyl sulfone (3,3'-DDS), bis-(4-(4-aminophenoxy)phenyl)sulfone (BAPS), 2,3,5,6-tetramethyl-1,4-phenylenediamine (DAM), 2,2-bis[4-(4-aminophenoxyphenyl)]propane (BAPP), 1,3-bis(3-aminophenoxy) benzene (APB-133), 4,4'-bis(4-amino-2-trifluoromethylphenoxy) biphenyl, 4,4'-[1,3-phenylenebis(1-methyl-ethylidene)], and bisaniline (bisaniline-M) with the following provisos:

i) if X is O, then Y is not MPD, BAPS 3,4'-ODA, BAPP, APB-133, or bisaniline-M;
ii) if X is S(O)$_2$, then Y is not 3,3'-DDS;

iii) if X is O-Ph-C(CH$_3$)$_2$-Ph-O or O-Ph-O—, then Y is not MPD, 3,4'-ODA, DAM, BAPP, APB-133, or bisaniline-M; and (c) an organic solvent comprising one or more components selected from the group with structures II, III, IV, V and VI:

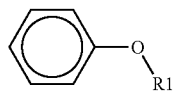

II

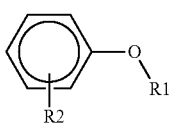

III

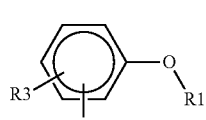

IV

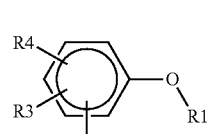

V

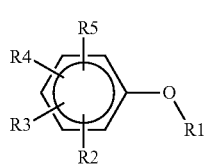

VI wherein R1=CH$_3$, CH$_2$CH$_3$, CH$_2$CH$_2$CH$_3$, or CH(CH$_3$)$_2$; R2=CH$_3$, CH$_2$CH$_3$, OCH$_3$, OCH$_2$CH$_3$, C(O)OCH$_3$ or CH$_2$Cl; R3=H, CH$_3$, CH$_2$CH$_3$ or OCH$_3$; R4=CH$_3$ or CH$_2$CH$_3$ and R5=CH$_3$;

wherein said polyimide-based polymer thick film composition has been dried to remove said solvent and form said resistor.

5. A polyimide-based polymer thick film composition comprising:

(a) a non-fluorinated polyimide polymer with the structure I

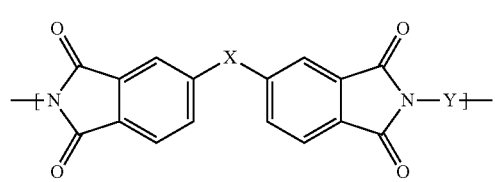

I wherein X is O-Ph-C(CH$_3$)$_2$-Ph-O and Y is 1,3-bis(3-aminophenoxy) benzene (APB-133) and;

(b) an organic solvent comprising one or more components selected from the group with the structure IV

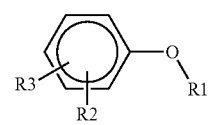

IV wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H.

6. A polyimide-based polymer thick film composition comprising:

(a) a non-fluorinated polyimide polymer with the structure I

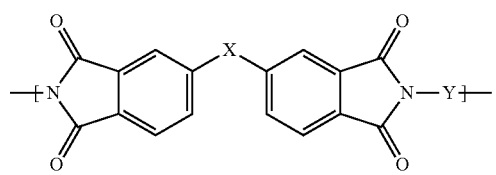

I wherein X is O-Ph-C(CH$_3$)$_2$-Ph-O and Y is 2,2-bis[4-(4-aminophenoxyphenyl)]propane (BAPP) and;

(b) an organic solvent comprising one or more components selected from the group with the structure IV

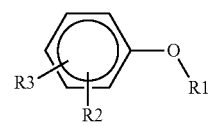

IV wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H.

7. An electrical circuit comprising a conductor formed from a polyimide-based polymer thick film composition comprising:

(a) silver powder;

(b) a non-fluorinated polyimide polymer with the structure I

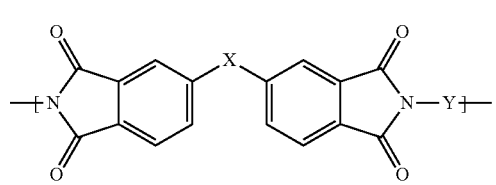

I wherein X is O-Ph-C(CH$_3$)$_2$-Ph-O and Y is 1,3-bis(3-aminophenoxy) benzene (APB-133); and (c) an organic solvent comprising one or more components selected from the group with structure IV

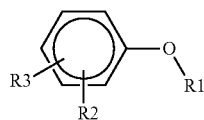

wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H and wherein said polyimide-based polymer thick film composition has been dried to remove said solvent and form said conductor.

8. An electrical circuit comprising a conductor formed from a polyimide-based polymer thick film composition comprising:
(a) silver powder;
(b) a non-fluorinated polyimide polymer with the structure I

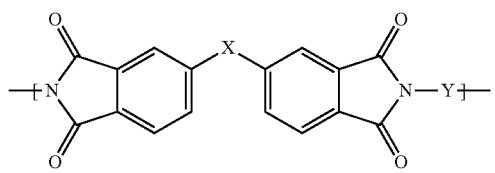

wherein X is O-Ph-C(CH$_3$)$_2$-Ph-O and Y is 2,2-bis[4-(4-aminophenoxyphenyl)]propane (BAPP); and
(c) an organic solvent comprising one or more components selected from the group with structure IV

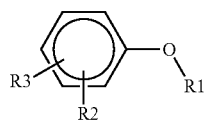

wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H and wherein said polyimide-based polymer thick film composition has been dried to remove said solvent and form said conductor.

9. An electrical circuit comprising a dielectric formed from a polyimide-based polymer thick film composition comprising:
(a) a powder selected from the group consisting of boron nitride powder, titanium dioxide powder or a mixture thereof;
(b) a non-fluorinated polyimide polymer with the structure I

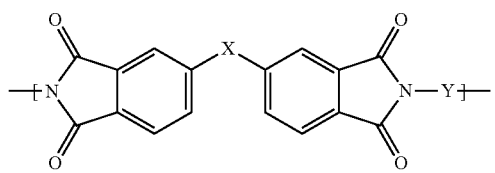

wherein X is O-Ph-C(CH$_3$)$_2$-Ph-O and Y is 1,3-bis(3-aminophenoxy) benzene (APB-133); and
(c) an organic solvent comprising one or more components selected from the group with structure IV

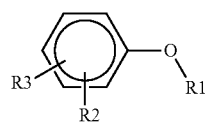

wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H and wherein said polyimide-based polymer thick film composition has been dried to remove said solvent and form said dielectric.

10. An electrical circuit comprising a dielectric formed from a polyimide-based polymer thick film composition comprising:
(a) a powder selected from the group consisting of boron nitride powder, titanium dioxide powder or a mixture thereof;
(b) a non-fluorinated polyimide polymer with the structure I

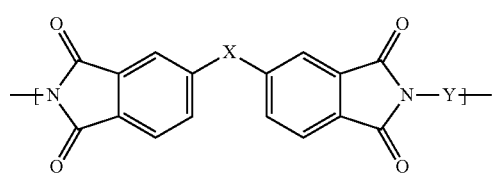

wherein X is O-Ph-C(CH$_3$)$_2$-Ph-O and Y is 2,2-bis[4-(4-aminophenoxyphenyl)]propane (BAPP); and
(c) an organic solvent comprising one or more components selected from the group with structure IV

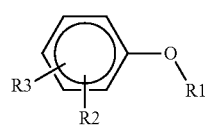

wherein R1=CH$_3$, R2=OCH$_3$ and R3=H; R1=CH$_3$, R2=OCH$_3$ and R3=CH$_3$; or R1=CH$_3$, R2=C(O)OCH$_3$ and R3=H and wherein said polyimide-based polymer thick film composition has been dried to remove said solvent and form said dielectric.

* * * * *